United States Patent [19]

Heinecke et al.

[11] Patent Number: 4,749,589
[45] Date of Patent: Jun. 7, 1988

[54] METHOD OF SURFACE TREATMENT

[75] Inventors: Rudolf A. H. Heinecke; Sureshchandra M. Ojha; Ian P. Llewellyn, all of Harlow, England

[73] Assignee: STC plc, London, England

[21] Appl. No.: 806,820

[22] Filed: Dec. 10, 1985

[30] Foreign Application Priority Data

Dec. 13, 1984 [GB] United Kingdom ............... 8431442

[51] Int. Cl.$^4$ ............................................. B05D 3/06
[52] U.S. Cl. ........................................ 427/39; 427/47; 427/294
[58] Field of Search ...................... 427/39, 47, 294

[56] References Cited

FOREIGN PATENT DOCUMENTS

| 0095200 | 11/1983 | European Pat. Off. |
| 785878 | 11/1957 | United Kingdom . |
| 854989 | 11/1960 | United Kingdom . |
| 1153787 | 5/1969 | United Kingdom . |
| 1544172 | 4/1979 | United Kingdom . |
| 2105729 | 6/1985 | United Kingdom . |

*Primary Examiner*—Bernard D. Pianalto
*Attorney, Agent, or Firm*—Kerkam, Stowell, Kondracki & Clarke

[57] ABSTRACT

In a pulsed plasma process for surface treatment of a substrate the containing reactor vessel (11) has an inner cross-section conforming to the substrate geometry so as to confine the intense plasma region to the substrate surface (12). Preferably this region should be within 15 to 20 mm of the surface. Advantageously the inner surface is provided by a demountable insert (13).

4 Claims, 2 Drawing Sheets

METHOD OF SURFACE TREATMENT

This invention relates to pulsed radio frequency plasma treatment of substrate bodies and in particular to a reactor vessel for use in said treatment.

Plasma processing and in particular low temperature glow discharge plasma processing is potentially a very useful process for the surface processing of substrate materials. As a source of high energy radiation it can promote both physical and chemical changes at the surface of the substrate and can be used for etching, roughening, grafting and coating of the surface. It is possible to include more than one of these processes during a treatment so that one can sequentially carry out surface etching, cross-linking and layer or multi-layer deposition of a substrate by simply changing the gas composition. Such a process ensures the maximum possible adherence and compatability between different deposited layers and avoids other problems such as internal optical reflection caused by abrupt interfaces.

A significant development in plasma processing is the introduction of high intensity pulsed radio frequency techniques. Such a process is disclosed in our published specification No. 2105729A (R. A. H. Heinecke-S. M. Ojha-M. J. Cooke 30-2-2) which relates to a process for surface processing a heat sensitive substrate material comprising exposing the surface of the substrate to a high intensity radio frequency pulsed plasma of low average power, the plasma pulse producing a power density of at least a few kW per liter, typically about 100 w/cm$^3$.

The pulsed plasma discharge is of high intensity but of low average power. During each 'on' period an intense radio frequency grade causes substantially complete dissolution of the gas constituting the plasma. The active species thus produced during the pulse then react in the subsequent 'off' period.

We have now found that a further significant improvement in the pulsed plasma process may be obtained by confining the plasma discharge to the immediate vicinity of the substrate.

According to one aspect of the invention there is provided in a method of surface treatment of a substrate body by exposing the body surface to a pulsed radio frequency plasma discharge wherein the plasma is substantially completely dissociated during each said pulse, the improvement comprising confining the plasma discharge to a region adjacent the body surface.

According to another aspect of the invention there is provided a reactor vessel for treatment of a laminar substrate body surface with a pulsed radio-frequency plasma, wherein the reactor has a rectangular cross section corresponding to the configuration of the body whereby, in use, the plasma is confined adjacent the body surface.

As the active species in the plasma are prevented from escaping from the region adjacent the substrate surface a high conversion efficiency is obtained.

It will be appreciated that because of both the discontinuous nature of the discharge and the high energy density conditions present during each radio frequency pulse, conventional low power continuous plasma techniques cannot be employed to provide maximum coupling efficiency to the discharge.

An embodiment of the invention will now be described with reference to the accompanying drawings in which:

DETAILED DESCRIPTION OF THE DRAWING

Figure 1:
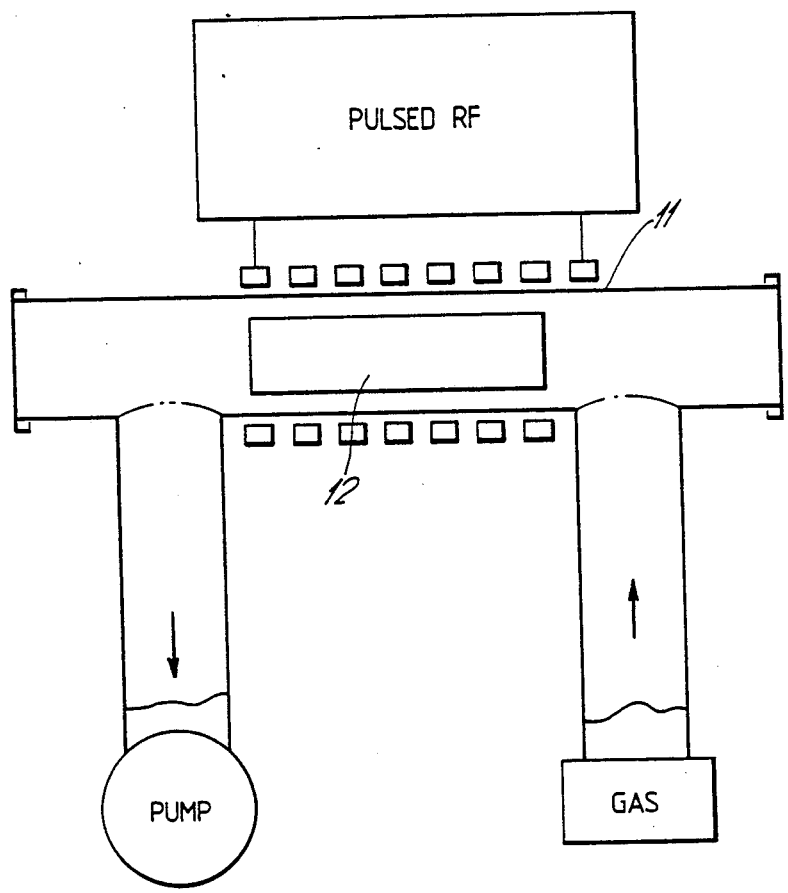
FIG. 1 is a schematic diagram of a pulsed plasma processing apparatus.
Figure 2:
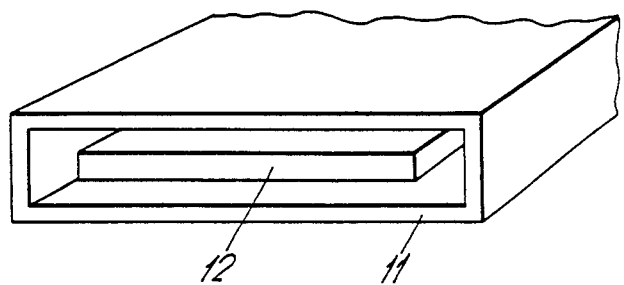
FIG. 2 is a part sectional view of a reactor vessel for use in the apparatus of FIG. 1.
Figure 3:
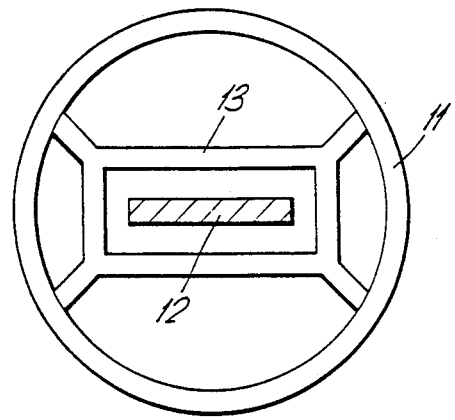
FIG. 3 is a cross-sectional view of an alternative reactor vessel.

Referring to FIG. 1, the plasma reactor vessel comprises a tubular body 11 having a cross-sectioned configuration corresponding to the shape of a substrate body 12 to be processed. Where the body 12 is laminar, e.g. a printed circuit board, the reactor vessel 11 is rectangular in cross-section as is shown in FIG. 2. Alternatively the plasma may be restricted to a region adjacent the substrate by shaped insert 13 (FIG. 3) placed in the vessel 11 and surrounding the body 12. A low pressure gas from which the plasma is to be formed is pumped through the vessel 11. Typically the plasma is maintained at a pressure of 1 to 1000 mtorr.

Advantageously the space between the insert 13 and the vessel 11 is sealed and pumped separately to a pressure high enough, typically 100 to 200 torr, to inhibit plasma formation. The same effect may be achieved by filling this space with a fibrous material, e.g. glass wool.

Figure 4:
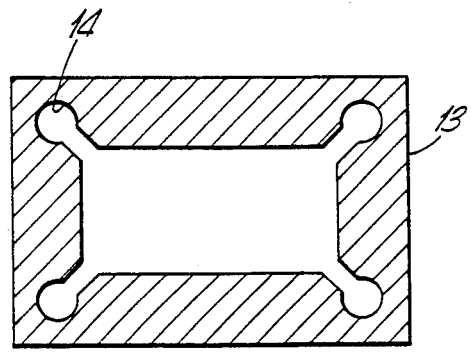
FIG. 4 shows a modified cross-section of the vessel of FIG. 2 or FIG. 3.

To affect surface treatment, e.g. etching or deposition, of the substrate body 12 pulsed radio frequency power is applied to the reactor vessel 11 via a work coil 13 surrounding the vessel and coupled to a generator (not shown). The power output of the generator is not critical but must be sufficient to provide the desired surface processing effect, i.e. sufficient to provide substantially complete dissolution of the plasma. We have found that pulse powers of 200 w/cm$^2$ to 250 w/cm$^2$ of the treated surface are adequate for this purpose. We have also found that the etching or deposition rate may be improved by the provision of longitudinal grooves 14 (FIG. 4) in the wall of the vessel 11 or the insert 13. When an electrically conductive material is being deposited the provision of longitudinal grooves in the insert 13 or the vessel 11 inhibits the formation of a continuous conductor loop which would provide a 'shorted turn' inhibiting coupling of radio frequency power to the plasma. For this purpose the grooves should have a small opening and a relatively large internal surface area.

Advantageously the generator pulse rate is matched to the gas exchange rate within the reactor vessel, i.e. the pulse rate is matched to the pumping speed such that one pulse is applied for each replenishment of gas in the vessel 11. Such a technique is described in our co-pending application No. 8505319 (R. A. H. Heinecke et al 38-6-1X). In some applications local intensification of the plasma may be provided by an applied magnetic field.

We have found that for optimum efficiency of the process the pulsed plasma should be confined to a region within 15 to 25 mm from the substrate surface. If, for example, the substrate is a circuit board 1 to 4 mm in thickness then the smaller dimension of the rectangular cross-section of the vessel 11 should be 31 to 44 mm.

For example, we have coated silicon wafer substrates with silicon nitride, silicon oxide and silicon using both confined and unconfined plasmas. Films of silicon nitride (from silane and nitrogen), silicon oxide (from silane and carbon dioxide) and silicon (from silane) have been deposited on 4 inch silicon wafers. Examination of interference fringes using light of a wavelength of 5000 A has shown that, for plasma confinement to the range specified above, a uniformity of 2500 A over the wafer surface of the above surface films is achieved for coating thicknesses in the range 0.3 to 5 microns. Outside this confinement region surface variations greater than 2,500 A were observed. Deposition was performed at pressures in the range 1 to 1000 motor and a generater pulse power density of 220 watt/cm$^2$ of the wafer surface.

We claim:

1. In a method of surface treatment of a substrate body by exposing the body surface to a pulsed radio frequency plasma discharge wherein the plasma is subjected to a pulsed power of 200 to 250 watts per square centimeter of the body surface whereby the plasma is substantially completely dissociated during each said pulse, the improvement comprising confining the plasma discharge to a region having a cross section configuration corresponding to the shape of the substrate body and adjacent the body surface, said region extending to a distance of 15 to 25 mm from the body surface.

2. A method as claimed in claim 1 wherein the plasma discharge is maintained at a pressure of 1 to 1000 mtorr.

3. A method as claimed in claim 1 wherein the plasma discharge is further confined by an applied magnetic field.

4. A method as claimed in claim 1 wherein the plasma discharge is confined in a shaped insert contained in a reactor vessel.

* * * * *